United States Patent
Shi et al.

(10) Patent No.: US 12,144,208 B2
(45) Date of Patent: Nov. 12, 2024

(54) DISPLAY PANEL, MANUFACTURING METHOD THEREOF AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Bo Shi, Beijing (CN); Chi Yu, Beijing (CN); Yue Long, Beijing (CN); Rui Zhou, Beijing (CN); Hui Guan, Beijing (CN); Weiyun Huang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 393 days.

(21) Appl. No.: 17/618,479

(22) PCT Filed: Jan. 5, 2021

(86) PCT No.: PCT/CN2021/070309
§ 371 (c)(1),
(2) Date: Dec. 12, 2021

(87) PCT Pub. No.: WO2022/147649
PCT Pub. Date: Jul. 14, 2022

(65) Prior Publication Data
US 2023/0157087 A1   May 18, 2023

(51) Int. Cl.
*H10K 59/124* (2023.01)
*H10K 59/12* (2023.01)
(Continued)

(52) U.S. Cl.
CPC ....... *H10K 59/124* (2023.02); *H10K 59/1201* (2023.02); *H10K 59/873* (2023.02); *H10K 59/122* (2023.02)

(58) Field of Classification Search
CPC ............ H10K 59/124; H10K 59/1201; H10K 59/873; H10K 59/122; H10K 59/65; H10K 59/121; H10K 59/00; H10K 50/80
See application file for complete search history.

(56) References Cited

U.S. PATENT DOCUMENTS

| | | | |
|---|---|---|---|
| 10,879,491 B1 * | 12/2020 | Yoo | H10K 77/10 |
| 2021/0143364 A1 * | 5/2021 | Jin | H10K 59/124 |
| 2021/0193769 A1 * | 6/2021 | Bok | H10K 59/60 |

FOREIGN PATENT DOCUMENTS

| | | |
|---|---|---|
| CN | 207338380 U | 5/2018 |
| CN | 109148537 A | 1/2019 |

(Continued)

*Primary Examiner* — J. E. Schoenholtz
(74) *Attorney, Agent, or Firm* — HOUTTEMAN LAW LLC

(57) ABSTRACT

A display panel, a manufacturing method thereof and a display apparatus are provided. The display panel is divided into a display region and at least one light transmission region at least partially surrounded by the display region, including a base substrate; a driving circuit layer; an anode layer; a first insulating layer over the anode layer and including a first insulating sub-layer in the display region and a second insulating sub-layer in the at least one light transmission region; a functional film layer in the at least one light transmission region, the functional film layer has a first thickness so that a height difference between a height of a surface of the first insulating sub-layer and a height of a surface of the second insulating sub-layer is less than a first threshold; and an encapsulation leveling layer arranged on surfaces of the first and second insulating sub-layer.

20 Claims, 8 Drawing Sheets

(51) Int. Cl.
*H10K 59/122* (2023.01)
*H10K 59/80* (2023.01)

(56) References Cited

FOREIGN PATENT DOCUMENTS

| | | |
|---|---|---|
| CN | 110649081 A | 1/2020 |
| CN | 110729328 A | 1/2020 |
| CN | 110943104 A | 3/2020 |
| CN | 111048688 A | 4/2020 |
| CN | 210575037 U | 5/2020 |
| CN | 111293235 A | 6/2020 |
| CN | 111834538 A | 10/2020 |
| CN | 112117320 A | 12/2020 |
| IN | 111276507 A | 6/2020 |

\* cited by examiner (a)

(b)

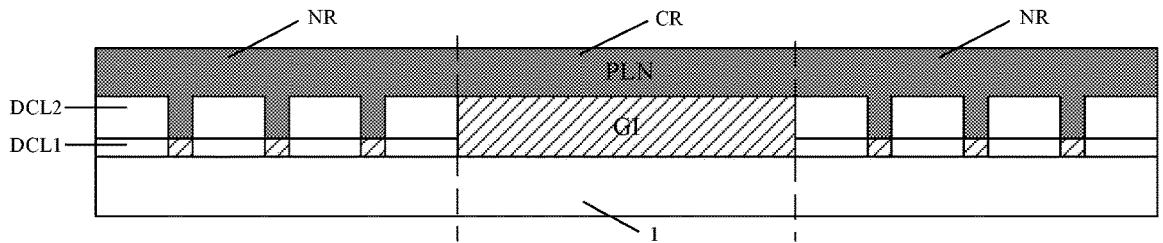

FIG. 9 forming the functional film layer in the at least one light transmission region on the base substrate includes: forming the driving circuit layer on the base substrate through a patterning process, while forming the driving circuit functional layer including a plurality of functional blocks in the at least one light transmission region on the base substrate through the same patterning process, the driving circuit functional layer being in a same layer as the built-in transistor driving layer, such that orthographic projections of the plurality of functional blocks on the base substrate are respectively within orthographic projections of the plurality of second anodes on the base substrate — S91

Sequentially forming the gate insulating layer, the interlayer dielectric layer, the planarization layer, the anode layer, the pixel defining layer, the first insulating layer, the encapsulation leveling layer, and the second insulating layer, on the base substrate — S92

FIG. 10

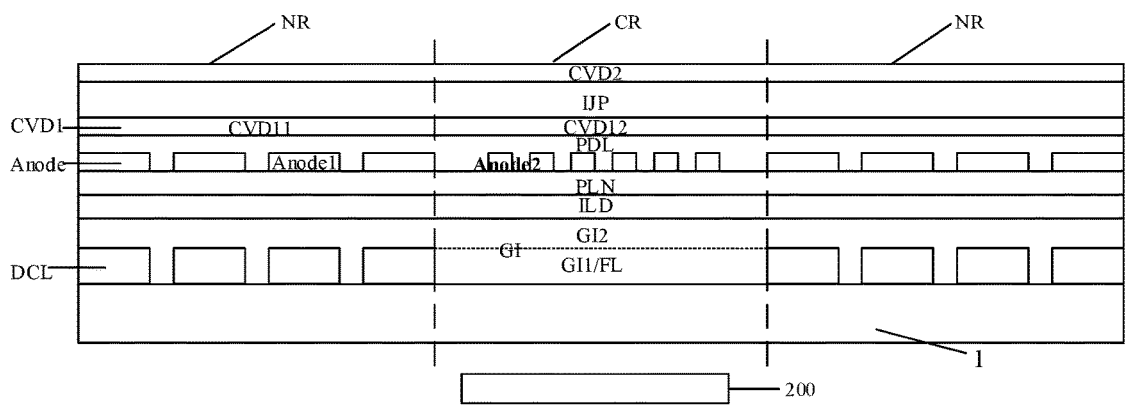

FIG. 11

DISPLAY PANEL, MANUFACTURING METHOD THEREOF AND DISPLAY APPARATUS

TECHNICAL FIELD

The present disclosure relates to the field of display technology, and particularly to a display panel, a manufacturing method thereof and a display apparatus.

BACKGROUND

Organic Light Emitting Diode (OLED) display panels are receiving more and more attention due to excellent characteristics of OLEDs themselves. An OLED display panel having an under-screen image pickup function is generally divided into a normal display region and a light transmission region capable of transmitting light and at least partially surrounded by the normal display region. To better ensure the imaging quality of the under-screen camera, OLED driving circuits in the light transmission region are usually cut away so that more light may pass through the display panel to image on the camera in the light transmission region.

SUMMARY

The present disclosure provides a display panel, a manufacturing method thereof and a display apparatus.

The display panel provided by the present disclosure includes: a normal display region and at least one light transmission region at least partially surrounded by the normal display region, wherein the display panel includes: a base substrate; a driving circuit layer which is arranged on the base substrate and includes a first driving circuit in the normal display region, for driving a plurality of sub-pixels in the normal display region; an anode layer including a first anode sub-layer disposed in the normal display region and over the driving circuit layer and a second anode sub-layer disposed in the at least one light transmission region, wherein the first anode sub-layer is connected to the first driving circuit and includes a plurality of first anodes insulated and spaced apart from each other, and the second anode sub-layer includes a plurality of second anodes insulated and spaced apart from each other; a first insulating layer disposed over the anode layer and including a first insulating sub-layer in the normal display region and a second insulating sub-layer disposed in the at least one light transmission region; a functional film layer located in the at least one light transmission region and on a side of the second insulating sub-layer proximal to the base substrate, wherein the functional film layer has a first thickness in a direction perpendicular to the base substrate, so that a height difference between a first height, in the direction perpendicular to the base substrate, of a first surface of the first insulating sub-layer away from the base substrate, and a second height, in the direction perpendicular to the base substrate, of a second surface of the second insulating sub-layer away from the base substrate, is less than a first threshold; and an encapsulation leveling layer arranged on the surfaces of the first insulating sub-layer and the second insulating sub-layer away from the base substrate.

In one embodiment, the display panel further includes a second driving circuit in a peripheral region which at least partially surrounds the normal display region, or in the normal display region, in a same layer as the first driving circuit, the second driving circuit being connected to the second anode sub-layer, for driving a plurality of sub-pixels in the at least one light transmission region.

In one embodiment, the display panel further includes an insulating film layer in the at least one light transmission region and the normal display region, wherein the functional film layer is arranged on a surface of the insulating film layer proximal to the base substrate; a height difference between a height, in the direction perpendicular to the base substrate, of a surface, of a portion of the insulating film layer in the at least one light transmission region, away from the base substrate, and a height, in the direction perpendicular to the base substrate, of a surface of a portion of the insulating film layer in the normal display region, away from the base substrate, is less than the first threshold; and the insulating film layer and the functional film layer have a one-piece structure.

In one embodiment, the insulating film layer includes a gate insulating layer on a side of the driving circuit layer away from the base substrate.

In one embodiment, the display panel further includes: an interlayer dielectric layer positioned on a surface of the gate insulating layer away from the base substrate; a planarization layer on a surface of the interlayer dielectric layer away from the base substrate, wherein the anode layer is disposed on the planarization layer; and a pixel defining layer on the anode layer, wherein the first insulating layer is disposed on the pixel defining layer.

In one embodiment, the insulating film layer includes an interlayer dielectric layer on a side of the driving circuit layer away from the base substrate.

In one embodiment, the display panel further includes: a gate insulating layer arranged on a surface of the driving circuit layer away from the base substrate, and positioned in the at least one light transmission region and the normal display region, wherein the functional film layer is positioned on a side of the gate insulating layer in the at least one light transmission region, away from the base substrate; wherein the insulating film layer includes an interlayer dielectric layer on a side of the gate insulating layer in the normal display region and the functional film layer, away from the base substrate.

In one embodiment, the display panel further includes: a planarization layer on a surface of the interlayer dielectric layer away from the base substrate, wherein the anode layer is disposed on the planarization layer; and a pixel defining layer on the anode layer, wherein the first insulating layer is disposed on the pixel defining layer.

In one embodiment, the insulating film layer is the first insulating layer; and the display panel further includes: a gate insulating layer arranged on a surface of the driving circuit layer away from the base substrate, and positioned in the at least one light transmission region and the normal display region; an interlayer dielectric layer positioned on a surface of the gate insulating layer away from the base substrate; and a planarization layer on a surface of the interlayer dielectric layer away from the base substrate, wherein the anode layer is arranged on the planarization layer, and a height, in the direction perpendicular to the base substrate, of a surface of the first anode sub-layer away from the base substrate, is greater than a height, in the direction perpendicular to the base substrate, of a surface of the second anode sub-layer away from the base substrate.

In one embodiment, the insulating film layer includes a planarization layer on a surface of the anode layer proximal to the base substrate.

In one embodiment, a material of the planarization layer is polyimide.

In one embodiment, the display panel further includes: a gate insulating layer arranged on a surface of the driving circuit layer away from the base substrate, and positioned in the at least one light transmission region and the normal display region; an interlayer dielectric layer on the gate insulating layer in the at least one light transmission region and the normal display region; and a pixel defining layer located on a side of the anode layer away from the base substrate.

In one embodiment, the functional film layer includes a driving circuit functional layer arranged on a surface of the base substrate in the at least one light transmission region proximal to the second anode sub-layer, and the driving circuit functional layer includes a plurality of functional blocks, and orthographic projections of the plurality of functional blocks on the base substrate at least partially overlap with orthographic projections of the plurality of second anodes on the base substrate.

In one embodiment, the display panel further includes: a gate insulating layer disposed on a surface of the driving circuit functional layer away from the base substrate, and located in the at least one light transmission region and the normal display region; an interlayer dielectric layer on the gate insulating layer; and a planarization layer on the interlayer dielectric layer, wherein the anode layer is disposed on the planarization layer.

In one embodiment, each of the plurality of functional blocks is floating, and each of the plurality of functional blocks includes a gate layer and a source/drain layer, identical to a gate layer and a source/drain layer of the first driving circuit.

In one embodiment, the functional film layer includes a gate insulating layer on the base substrate and located in the at least one light transmission region, and a difference between a height, in a direction perpendicular to the base substrate, of a surface of the gate insulating layer in the at least one light transmission region away from the base substrate, and a height, in a direction perpendicular to the base substrate, of a surface of the driving circuit layer away from the base substrate, is less than the first threshold.

In one embodiment, a material of the gate insulating layer, the interlayer dielectric layer, and the first insulating layer is silicon oxide, silicon nitride, and/or silicon oxynitride.

In one embodiment, a material of the encapsulation leveling layer is an organic material.

In one embodiment, an area of an orthographic projection of the second anode on the base substrate is smaller than an area of an orthographic projection of the first anode on the base substrate; and a second distance between every two adjacent second anodes of the plurality of second anodes is substantially equal to a first distance between every two adjacent first anodes of the plurality of first anodes.

In one embodiment, an area of an orthographic projection of the second anode on the base substrate is substantially equal to an area of an orthographic projection of the first anode on the base substrate.

The display apparatus provided by the present disclosure includes the display panel and at least one photosensitive device disposed within the at least one light transmission region of the display panel and on a side of the base substrate away from the anode layer.

The method for manufacturing the above display panel, provided by the present disclosure, includes: forming the driving circuit layer on the base substrate through a patterning process, so that the driving circuit layer includes the first driving circuit positioned in the normal display region, for driving a plurality of sub-pixels in the normal display region; forming the functional film layer in the at least one light transmission region on the base substrate, so that a difference between a height, in the direction perpendicular to the base substrate, of a surface of an exposed film layer in the at least one light transmission region away from the base substrate, and a height, in the direction perpendicular to the base substrate, of a surface of an exposed film layer in the normal display region away from the base substrate, is less than a first threshold; and forming the encapsulation leveling layer in the at least one light transmission region and the normal display region on the base substrate.

BRIEF DESCRIPTION OF DRAWINGS

In order to make one of ordinary skill in the art better understand the present disclosure, specific embodiments of the present disclosure are described below with reference to the accompanying drawings, wherein

FIG. 9 illustrates an example diagram of forming an OLED display panel according to an embodiment of the present disclosure;

FIG. 10 illustrates a flow chart of a method for manufacturing a display panel according to an embodiment of the present disclosure; and FIG. 11 illustrates a schematic diagram of an OLED display apparatus according to an embodiment of the present disclosure.

DETAIL DESCRIPTION OF EMBODIMENTS

In order to make one of ordinary skill in the art better understand the technical solution of the present disclosure, a display panel, and a manufacturing method thereof and a display apparatus provided by the present disclosure are described below in detail with reference to the accompanying drawings.

Figure 1A:
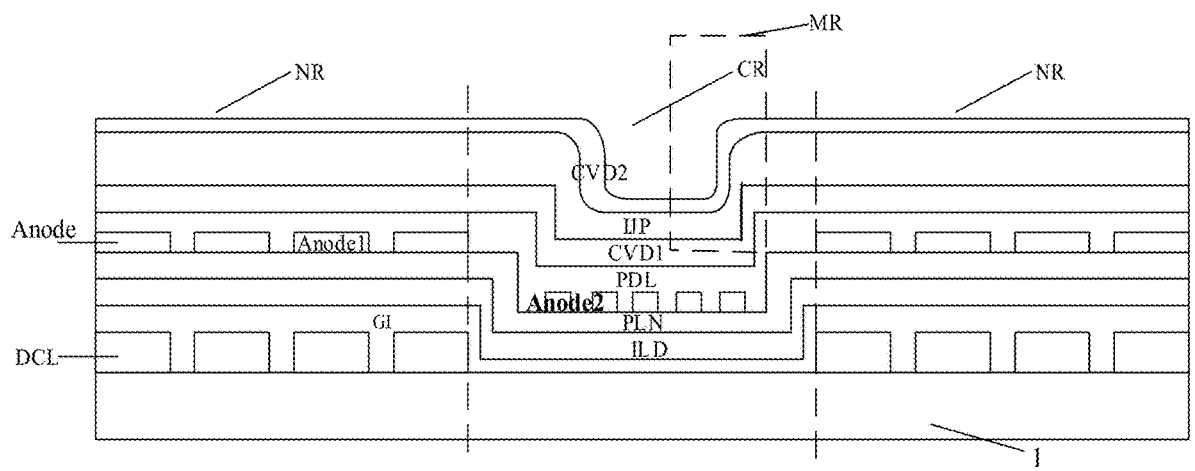
FIGS. 1A and 1B illustrate a cross-sectional view and a top view of an OLED display panel in the related art, respectively.
Figure 1B:
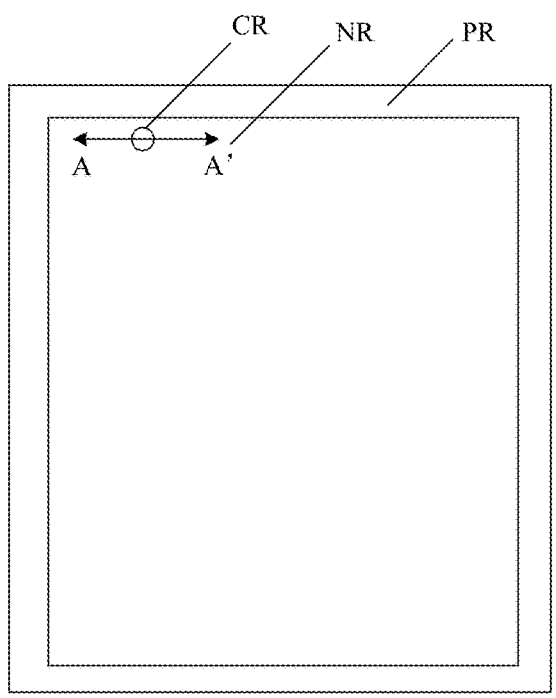

FIGS. 1A and 1B illustrate a cross-sectional view and a top view of an OLED display panel having a punch hole region in the related art, respectively. FIG. 1A is a cross-sectional view of the OLED display panel shown in FIG. 1B taken along a line AA'. The OLED display panel having the punch hole region is generally divided into a light transmission region CR, which may also be referred to as a punch hole region, and a normal display region NR. In the light transmission region CR, a camera may be disposed on a side of the OLED display panel opposite to a light outgoing side, so that light may penetrate through the OLED display panel to enter the camera.

As shown in FIG. 1A, the OLED display panel generally includes a base substrate 1. In the light transmission region CR, a gate insulating layer GI, an interlayer dielectric layer ILD, a planarization layer PLN, a second anode layer Anode2, a pixel defining layer PDL, a first insulating layer CVD1, an encapsulation leveling layer IJP, and a second insulating layer CVD2 are sequentially formed on the base substrate 1; in the normal display region NR, a driving circuit layer DCL, the gate insulating layer GI, the interlayer dielectric layer ILD, the planarization layer PLN, a first anode layer Anode1, the pixel defining layer PDL, the first insulating layer CVD1, the encapsulation leveling layer IJP, and the second insulating layer CVD2 are sequentially formed on the base substrate 1.

In the embodiment shown in FIG. 1A, the gate insulating layer GI, the interlayer dielectric layer ILD, the planarization layer PLN, the second anode layer Anode2, the pixel defining layer PDL, the first insulating layer CVD1, the encapsulation leveling layer IJP, the second insulating layer CVD2 in the light transmission region CR are respectively formed in the same layer as the gate insulating layer GI, the interlayer dielectric layer ILD, the planarization layer PLN, the first anode layer Anode1, the pixel defining layer PDL, the first insulating layer CVD1, the encapsulation leveling layer IJP, the second insulating layer CVD2 in the normal display region NR (i.e., the gate insulating layer GI, the interlayer dielectric layer ILD, the planarization layer PLN, the second anode layer Anode2, the pixel defining layer PDL, the first insulating layer CVD1, the encapsulation leveling layer IJP, the second insulating layer CVD2 in the light transmission region CR and the gate insulating layer GI, the interlayer dielectric layer ILD, the planarization layer PLN, the first anode layer Anode1, the pixel defining layer PDL, the first insulating layer CVD1, the encapsulation leveling layer IJP, the second insulating layer CVD2 in the normal display region NR have a one-piece structure, respectively). The difference between the light transmission region CR and the normal display region NR is only: in order to increase the light transmittance of the light transmission region CR, a corresponding driving circuit for driving and controlling the OLED device in the light transmission region CR is externally disposed. That is, a driving circuit layer for driving the OLED device is not disposed in the light transmission region CR, and may be disposed, for example, in a peripheral region PR shown in FIG. 1B, but the present disclosure is not limited thereto. For example, the display panel of the present disclosure may not include the peripheral region PR, and a driving circuit for driving the light-emitting device in the light transmission region CR may be compressed and then disposed at a position in a built-in driving transistor layer for driving the OLED device in the normal display region NR.

Figure 1C:
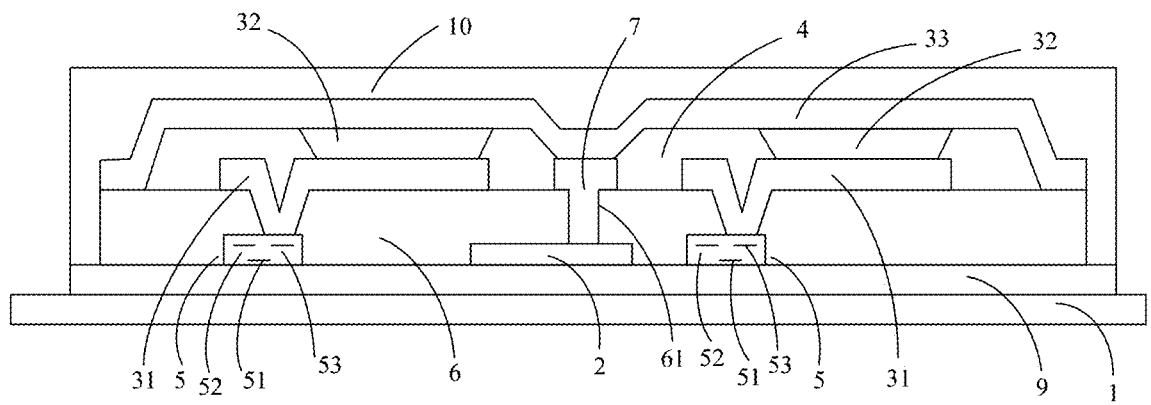
FIG. 1C illustrates a cross-sectional view of a part of a light emitting device and a driving circuit layer of a sub-pixel in the related art.

FIG. 1C illustrates respective OLED devices in an OLED display panel according to an embodiment of the present disclosure. A general OLED device includes a base substrate 1, a barrier layer 9 formed on the base substrate 1, a thin film transistor (TFT) 5 including a gate electrode 51, a source electrode 52, and a drain electrode 53, an insulating layer 6, a cathode connection line 2, a connection electrode 7 disposed in a via hole 61, an anode 31, a light emitting layer 32, a cathode 33, a pixel defining layer 4, a thin film encapsulation layer 10, and the like.

FIG. 1C is merely an example, and the present disclosure is not limited thereto. For example, the insulating layer 6 shown in FIG. 1C may be the gate insulating layer GI and/or the planarization layer PLN shown in FIG. 1A, the layer where the thin film transistor 5 in FIG. 1C is located may be the driving circuit layer DCL shown in FIG. 1A, the layer where the anode 31 shown in FIG. 1C is located may be the first anode layer Anode1 or the second anode layer Anode2 shown in FIG. 1A, the pixel defining layer 4 shown in FIG. 1C may be the pixel defining layer PDL shown in FIG. 1A, and the thin film encapsulation layer 10 shown in FIG. 1C may be the first insulating layer CVD1 shown in FIG. 1A.

Figure 1D:
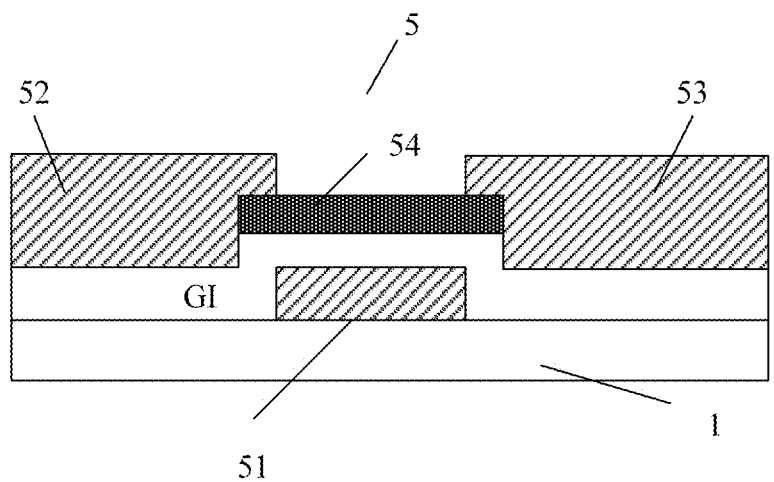
FIGS. 1D and 1E illustrate cross-sectional views of a part of a driving circuit layer in the related art, respectively.

The thin film transistor 5 may be, for example, a bottom gate type thin film transistor shown in FIG. 1D, and may include the gate electrode 51, the gate insulating layer GI, an active layer 54, the source electrode 52, and the drain electrode 53 on the base substrate 1. When such the bottom gate type thin film transistor is used in a display substrate, the topmost layer of the thin film transistor 5, after the thin film transistor 5 is formed and before the anode layer is formed, should be, for example, the planarization layer PLN shown in FIG. 1A instead of the gate insulating layer GI.

Figure 1E:
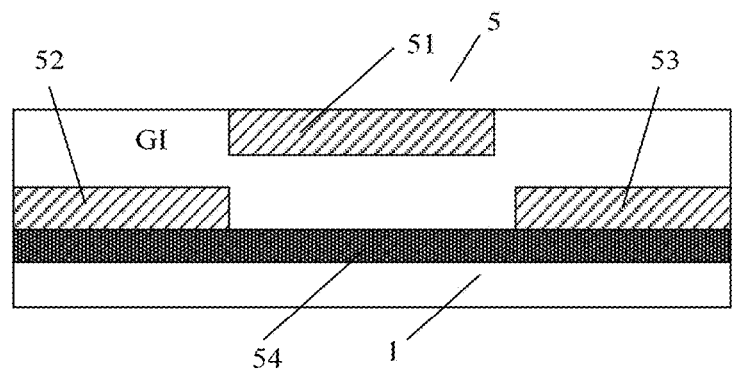
Figure 1E:
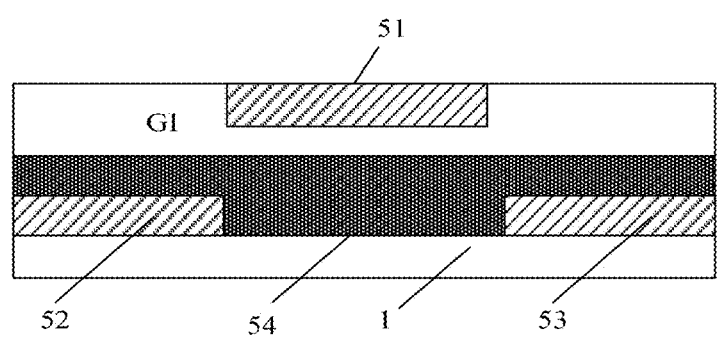

The thin film transistor 5 may be, for example, a top gate type thin film transistor shown in part (a) of FIG. 1E, and may include the active layer 54, the source electrode 52, the drain electrode 53, the gate insulating layer GI, and the gate electrode 51 formed on the gate insulating layer GI, which are on the base substrate 1; alternatively, the thin film transistor 5 may be, for example, the top gate type thin film transistor shown in part (b) of FIG. 1E, which may include the source electrode 52, the drain electrode 53, the active layer 54, the gate insulating layer GI, and the gate electrode 51 formed on the gate insulating layer GI, which are on the base substrate 1. When these two kinds of top gate type thin film transistors are used to drive the OLED light emitting device in the display substrate, the topmost layer of the thin film transistor 5, after the thin film transistor 5 is formed and before the anode layer is formed, may be, for example, the gate insulating layer GI as shown in FIG. 1A, and the planarization layer is formed on the gate insulating layer GI.

In order to increase the light transmittance of the light transmission region CR, as shown in FIG. 1A, for the OLED light-emitting devices in the light transmission region CR, a driving circuit layer mainly including a TFT driving circuit for driving the light-emitting devices is externally disposed. For example, the driving circuit layer may be disposed in the peripheral region PR as shown in FIG. 1B to increase the light transmittance of the light transmission region CR.

As shown in FIG. 1A, in a display panel in which the TFT driving circuit in the light transmission region CR is externally disposed or the TFT driving circuit for driving the OLED device in the light transmission region CR is compressed and then disposed in the normal display region NR, the light transmission region CR is recessed with respect to the normal display region NR at the periphery thereof, which results in a step difference (for example, a height difference of about 0.7 μm may exist) between the light transmission region CR and the normal display region NR, and thus, the encapsulation leveling layer IJP formed later by, for example, an inkjet printing method, has a recess MR in the light transmission region CR, thereby generating a non-standard concave lens structure. With such a structure, the light cannot focus on the image plane, generating spherical aberration and astigmatism, and therefore resulting in distortion of diffraction light and reduction in imaging resolution.

To this end, according to one embodiment of the present disclosure, as shown in FIG. 1B, there is provided an OLED display panel including: a normal display region NR, at least one light transmission region CR at least partially surrounded by the normal display region NR, and a peripheral region PR disposed at least partially around the normal display region NR. The display panel includes: a base substrate 1; a driving circuit layer DCL which is provided on the base substrate 1 and includes a built-in transistor driving layer (first driving circuit) positioned in the normal display region NR, for driving a plurality of sub-pixels in the normal display region NR; an anode layer Anode including a first anode sub-layer Anode1 disposed in the normal display region NR and over the driving circuit layer DCL and a second anode sub-layer Anode2 disposed in the at least one light transmission region CR, wherein the first anode sub-layer Anode1 is connected to the built-in transistor driving layer and includes a plurality of first anodes insulated and spaced apart from each other (shown in FIG. 1B), and the second anode sub-layer Anode2 includes a plurality of second anodes insulated and spaced apart from each other; a first insulating layer CVD1 disposed over the anode layer Anode and including a first insulating sub-layer CVD11 positioned in the normal display region and a second insulating sub-layer CVD12 disposed in the at least one light transmission region; a functional film FL located in the at least one light transmission region CR and on a side of the second insulating sub-layer CVD12 proximal to the base substrate 1, wherein the functional film FL is configured such that a height difference between a first height H1, in a direction perpendicular to the base substrate 1, of a first surface of the first insulating sub-layer CVD11 away from the base substrate 1, and a second height H2, in the direction perpendicular to the base substrate 1, of a second surface of the second insulating sub-layer CVD12 away from the base substrate 1, is less than a first threshold; and a one-piece encapsulation leveling layer IJP provided on a surface of the first insulating layer CVD1 away from the base substrate 1 and located in the at least one light transmission region CR and the normal display region NR.

The display panel provided with the under-screen camera is described in the present disclosure by taking the OLED display panel as an example, but the present disclosure is not limited thereto, and other types of display panels are also possible, which are not limited by the present disclosure.

In the display panel of the embodiment of the present disclosure, the display panel including the light transmission region CR, the display region NR surrounding the light transmission region CR, and the peripheral region PR at least partially surrounding the display region NR, as well as the thin film transistors included in the driving circuit layer and the light emitting device driven by the thin film transistors, the bottom gate type thin film transistors, and the top gate type thin film transistors, as illustrated in FIGS. 1B to 1E, may be employed. However, the present disclosure is not limited thereto, and the specific configurations of the driving circuit layer and the OLED device may be selected according to practical applications, and then the position where the functional film layer is disposed may be selected.

In order to avoid the problem of related art that the encapsulation leveling layer IJP formed on the driving circuit layer is recessed at the light transmission region CR due to the absence of the driving circuit layer in the light transmission region CR, in the present disclosure, the functional film layer FL is provided in the light transmission region CR, which increases a height of layers under the encapsulation leveling layer in the light transmission region CR, for example, a height of a portion of the first insulating sub-layer under the encapsulation leveling layer in the light transmission region CR is substantially equal to a height of a portion thereof in the normal display region NR, so that when the encapsulation leveling layer is formed on the first insulating layer consisting of the first insulating sub-layer and the second insulating sub-layer, for example, by means of ink jet printing, the encapsulation leveling layer over the entire surface of the display panel is almost flat, improving the leveling properties of the encapsulation leveling layer, therefore, the problems, of distortion of diffraction spots and reduction in imaging resolution caused by the fact that the encapsulation leveling layer is recessed in the light transmission region CR, may be avoided.

Figure 2A:
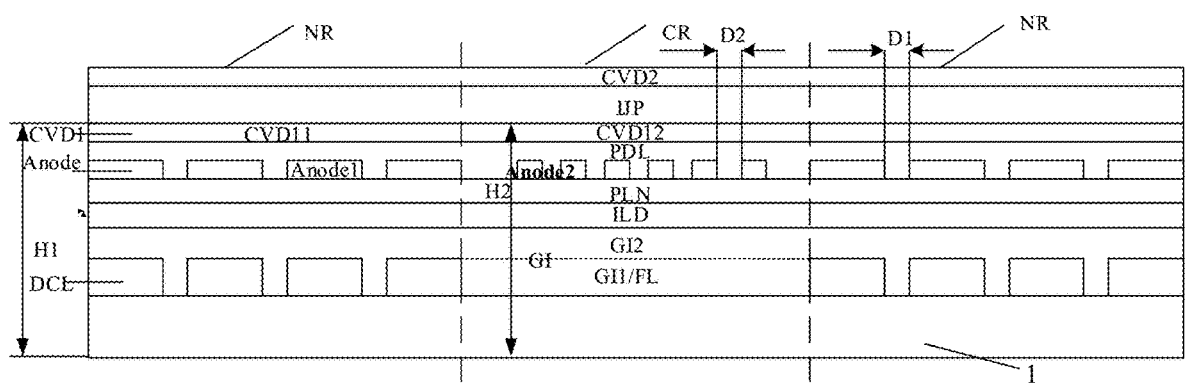
FIGS. 2A and 2B illustrate a cross-sectional view and a top view of an OLED display panel according to an embodiment of the present disclosure, respectively.
Figure 2B:
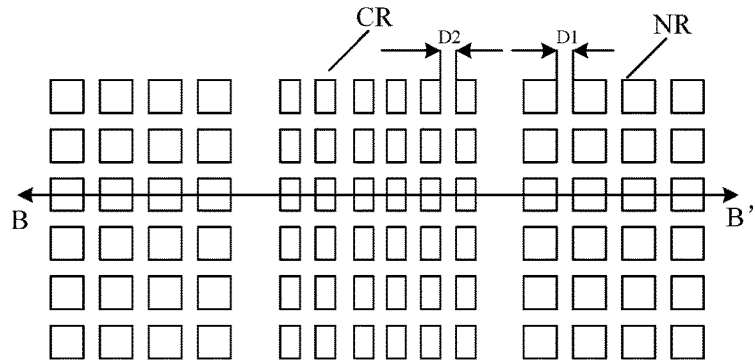

FIGS. 2A and 2B illustrate a cross-sectional view and a top view of a display panel according to an embodiment of the present disclosure, respectively. Unlike the display panel in related art shown in FIG. 1A, the display panel of the embodiment of the present disclosure includes a base substrate 1, an interlayer dielectric layer ILD, a planarization layer PLN, an anode layer Anode, a pixel defining layer PDL, a first insulating layer CVD1, an encapsulation leveling layer IJP, and a second insulating layer CVD2 formed on the base substrate 1. As shown in FIG. 2A, the display panel of the embodiment of the present disclosure further includes a first gate insulating sub-layer GI1 as a functional film layer FL formed in the light transmission region CR, and a difference between a height of the first gate insulating sub-layer GI1 and a height of the driving circuit layer DCL in the normal display region NR is less than the first threshold (for example, the first threshold may be 0.2 μm, and there is a better effect where the difference is less than 0.1 μm). For example, the heights of the first gate insulating sub-layer GI1 and the driving circuit layer DCL in the normal display region NR are substantially the same. In this way, a leveling property of a subsequently formed encapsulation leveling layer IJP may be improved, aberrations may be reduced, and resolution may be improved. In this embodiment, the display panel may further include a (or one-piece) second gate insulating sub-layer GI2 having a one-piece structure in both the light transmission region CR and the normal display region NR. In one embodiment, the first gate insulating sub-layer GI1 and the second gate insulating sub-layer GI2 may have a one-piece structure. For example, a pattern of the driving circuit layer DCL may be formed on the base substrate 1 by using a method shown in FIG. 8, such that the driving circuit layer DCL is disposed only in the normal display region NR; then, a gate insulating layer material is formed of a silicon oxide, silicon nitride, or silicon oxynitride material on the base substrate through, for example, vapor deposition, and the formed gate insulating layer material is recessed in the light transmission region CR since the driving circuit layer DCL is not provided in the light transmission region CR; then, with a half-tone mask, more gate insulating layer material in the normal display region NR is removed through an ashing process, leaving more gate insulating layer material in the light transmission region CR, so that the gate insulating layer material in the light transmission region CR and the gate insulating layer material in the normal display region NR are substantially flush, for example, the height difference between the light transmission region CR and the normal display region NR may be less than the first threshold. That is, after the ashing process, the gate insulating layer material in the light transmission region CR is substantially flush with the gate insulating layer material in the normal display region NR. As shown in FIG. 2A, the functional film layer FL is provided such that surfaces of the second gate insulating sub-layer GI2 of the display panel are almost flush with each other in the light transmission region CR and the normal display region NR, which ensures that the second insulating sub-layer CVD12 in the light transmission region CR and the first insulating sub-layer CVD11 in the normal display region NR, which are included in the first insulating layer CVD1 in contact with the encapsulation leveling layer IJP, are flush with each other, thereby ensuring that a substantially flat encapsulation leveling layer IJP may be formed. The flat encapsulation leveling layer IJP is formed, which may solve the problem of distortion of diffraction spots and reduction in imaging resolution caused by the recess of the encapsulation leveling layer IJP in the light transmission region CR in related art, as shown in FIG. 1A.

Figure 2C:
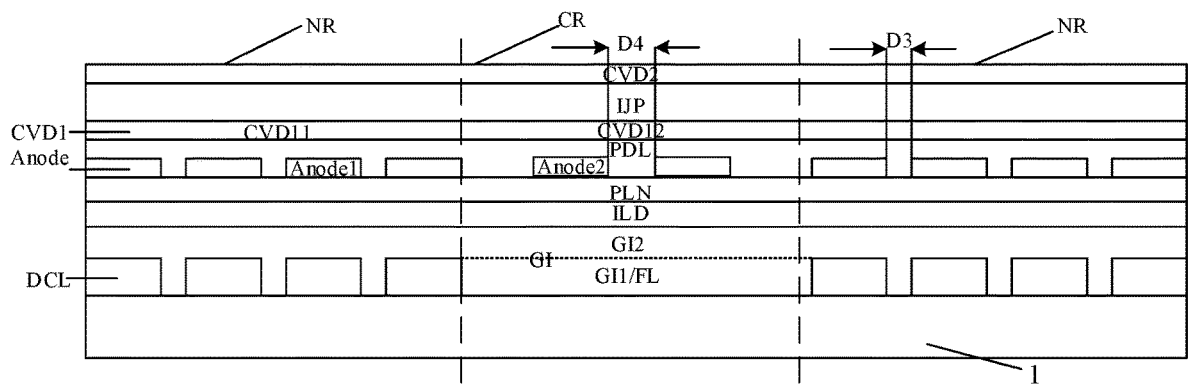
FIGS. 2C and 2D illustrate a cross-sectional view and a top view of an OLED display panel according to an embodiment of the present disclosure, respectively.
Figure 2D:
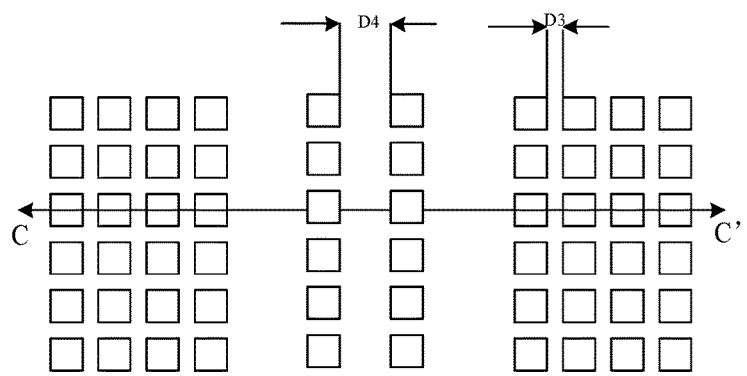

As shown in FIGS. 2A and 2B, in the light transmission region CR, the second anode layer Anode2 includes a plurality of second anodes; in the normal display region NR, the first anode layer Anode1 includes a plurality of first anodes. As shown in FIGS. 2A and 2B, an area of an orthogonal projection of the second anode on the base substrate 1 is smaller than an area of an orthogonal projection of the first anode on the base substrate 1, and a second distance D2 between any two adjacent of the plurality of second anodes may be substantially equal to a first distance D1 between any two adjacent of the plurality of first anodes. The first distance D1 represents a distance between two nearest points respectively on the two adjacent first anodes, and the second distance D2 represents a distance between two nearest points respectively on the two adjacent second anodes. The first distance D1 is substantially equal to the second distance D2, such that the light transmittance of the light transmission region CR may be enhanced. However, the present disclosure is not limited thereto, and for example, the second anodes and the first anodes having substantially the same size are respectively disposed in the light transmission region CR and the normal display region NR. In this case, the number of the second anodes disposed in the light transmission region CR is reduced to increase the distance between any two adjacent second anodes in the light transmission region CR, which may ensure the light transmittance of the light transmission region CR, as shown in FIGS. 2C and 2D. A distance D4 between any two adjacent second anodes in the light transmission region CR is greater than a distance D3 between any two adjacent first anodes in the normal display region NR.

The driving transistor employed in the driving circuit layer DCL of the display panel of the embodiment shown in FIGS. 2A to 2D may be a top gate type thin film transistor as shown in FIG. 1E. It is to be noted that the display panel of FIGS. 2A to 2D is not limited to a top gate type thin film transistor as the driving circuit. For example, other transistors may be used as the driving circuit. That is, the driving transistor in the display panel, in which the height difference between the light transmission region CR and the normal display region NR is compensated by using a portion of the gate insulating layer GI as the functional film layer, is not limited to the top gate type thin film transistor. In this embodiment, a top type gate thin film transistor is taken as an example for description, and the functional film layer for compensating the height difference may be formed only by directly using the process of forming the gate insulating layer in the process of forming the top gate type transistor, such that the whole method for the display panel may be simpler, and the manufacturing cost is saved. However, alternatively, it should be understood that, without changing the existing process, the functional film layer may be formed by using the existing process for forming the gate insulating layer after the driving transistor (not necessarily the top gate type thin film transistor) is formed. In this way, the manufacturing method becomes simpler to some extent.

Figure 2E:
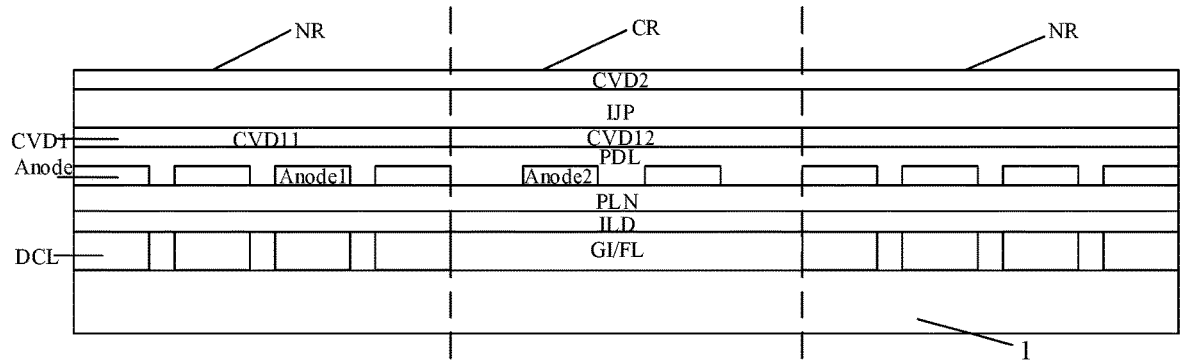
FIG. 2E illustrates a cross-sectional view of an OLED display panel according to an embodiment of the present disclosure.

The driving transistor employed in the driving circuit layer DCL in the display panel in the embodiment shown in FIG. 2E may be a bottom gate type thin film transistor as shown in FIG. 1D. In the manufacturing process for the bottom gate type thin film transistor, a gate electrode and a gate insulating layer are formed firstly, and then, an active layer and a source/drain electrode are formed. Therefore, for the display panel based on the bottom gate type thin film transistor, in the process of forming the gate insulating layer, a height of the gate insulating layer in the light transmission region CR is greater than a height of the gate insulating layer of the thin film transistor in the peripheral normal display region NR by a margin; then, the active layer and the source/drain of the thin film transistor in the normal display region NR are formed, which compensates for the margin, so that the height difference between the two regions (the light transmission region CR and the normal display region NR) is less than the first threshold, so as to ensure the leveling property of the encapsulation leveling layer IJP formed later. For example, as shown in FIG. 9, the gate electrode and the gate insulating layer of the driving transistor are formed in the normal display region NR on the base substrate 1, and at this time, a thicker gate insulating layer is formed in the light transmission region CR at the same time; then, the active layer and the source/drain electrode of the driving transistor are formed in the normal display region NR, such that a difference between a height of the normal display region NR and a height of the light transmission region CR is less than the first threshold, i.e., the height difference between the two regions is reduced. In this process, the gate insulating layers having different heights in the light transmission region and the normal display region may be formed by using a semi-permeable mask while forming the gate insulating layer.

The above embodiments of the present disclosure show only a part of the light emitting device, that is, the anode layer Anode and the pixel defining layer PDL. As known to one of ordinary skill in the art, for example, as shown in FIG. 1C, after forming the pixel defining layer PDL, it is necessary to form the light emitting layer and the cathode of the light emitting device in a groove formed in the pixel defining layer PDL. Thus, although the concept of the present disclosure is illustrated in the embodiment of the present disclosure in which the pixel defining layer PDL is a flat layer, those skilled in the art should understand that each layer may be specifically designed in a specific practical application. For example, the pixel defining layer PDL shown in the drawings of the embodiments of the present disclosure may be a layer after the light emitting device is formed.

Figure 3A:
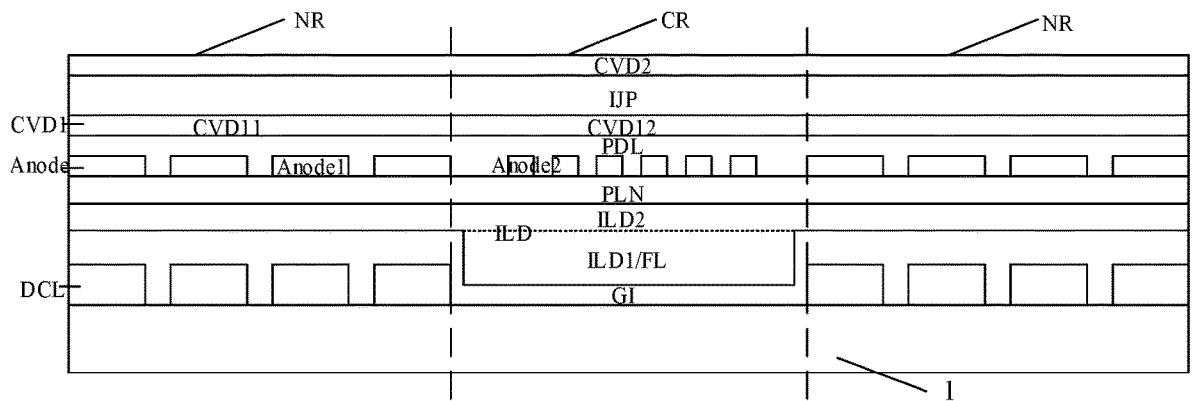
FIG. 3A illustrates a cross-sectional view of an OLED display panel according to an embodiment of the present disclosure.
Figure 3B:
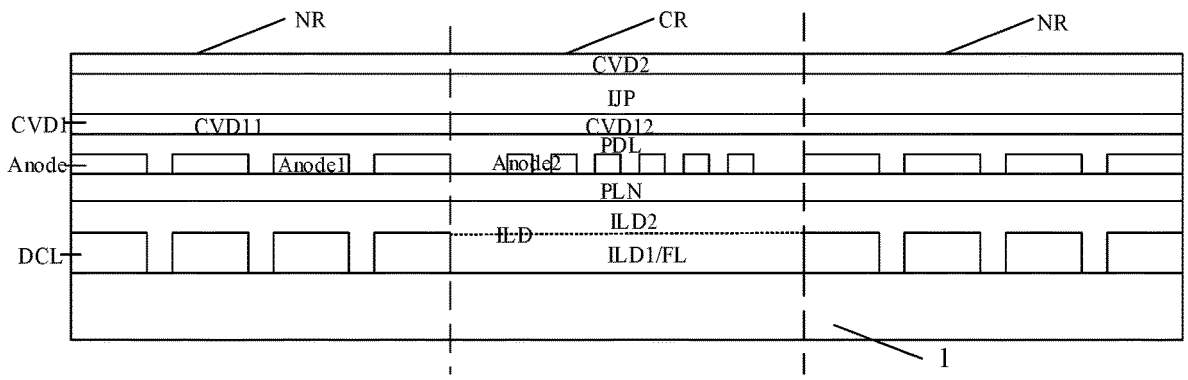
FIG. 3B illustrates a cross-sectional view of an OLED display panel according to an embodiment of the present disclosure.

FIG. 3A illustrates a schematic cross-sectional view of a display panel according to an embodiment of the present disclosure. Unlike the display panel in related art shown in FIG. 1A, the display panel of the embodiment of the present disclosure includes a base substrate 1, a gate insulating layer GI, a planarization layer PLN, an anode layer Anode, a pixel defining layer PDL, a first insulating layer CVD1, an encapsulation leveling layer IJP, and a second insulating layer CVD2 formed on the base substrate. As shown in FIG. 3A, the display panel of the embodiment of the present disclosure further includes a first interlayer dielectric sub-layer ILD1 as a functional film FL formed in the light transmission region CR, and a height of the first interlayer dielectric sub-layer ILD1 and a height of the gate insulating layer GI in the normal display region NR may be substantially the same, or a difference between the heights of the first interlayer dielectric sub-layer ILD1 and the gate insulating layer GI in the normal display region NR is less than the first threshold (for example, the first threshold may be 0.2 µm, and the effect is better when the height difference is less than 0.1 µm). The display panel further includes a (or one-piece) second interlayer dielectric sub-layer ILD2 having a one-piece structure formed in both the light transmission region CR and the normal display region NR. Alternatively, the first interlayer dielectric sub-layer ILD1 and the second interlayer dielectric sub-layer ILD2 may have a one-piece structure. For example, the interlayer dielectric layer material (e.g., silicon oxide, silicon nitride, or silicon oxynitride) in the light transmission region CR may be substantially flush with the interlayer dielectric layer material in the normal display region NR through an ashing process and by a half-tone mask, similarly to the method shown in FIG. 7. As shown in FIG. 3A, the functional film layer FL is provided, such that surfaces of the second interlayer dielectric sub-layer of the display panel are almost flush with each other in the light transmission region CR and the normal display region NR, which ensures that the second insulating sub-layer CVD12 in the light transmission region CR and the first insulating sub-layer CVD11 in the normal display region NR, which are included in the first insulating layer CVD1 in contact with the encapsulation leveling layer IJP, are flush with each other, thereby ensuring that a substantially flat encapsulation leveling layer IJP may be formed. The flat encapsulation leveling layer IJP is formed, which may solve the problem of distortion of diffraction spots and reduction in imaging resolution caused by the recess of the encapsulation leveling layer IJP in the light transmission region CR as shown in FIG. 1A in related art.

In the display panel shown in FIG. 3A, the gate insulating layer GI is disposed between the interlayer dielectric layer ILD and the driving circuit layer DCL. For example, in the display panel of the present disclosure, after the driving circuit layer DCL (e.g., including the top gate type transistor shown in FIG. 1E) is formed, the uppermost layer of the entire driving circuit layer DCL may be an entire gate insulating layer GI having a uniform thickness. For example, the gate electrode may be embedded in the gate insulating layer GI; or a thickness of the gate electrode is less with respect to a thickness of the gate insulating layer GI. However, the present disclosure is not limited thereto. Alternatively, when the bottom gate type transistor shown in FIG. 1C may be adopted in the display panel of the present disclosure, the gate insulating layer GI may be formed below the source electrode and the drain electrode, and the uppermost layer of the driving circuit layer DCL formed in this case may be the first interlayer dielectric sub-layer ILD1 and the second interlayer dielectric sub-layer ILD2 as in the above embodiment.

Figure 4:
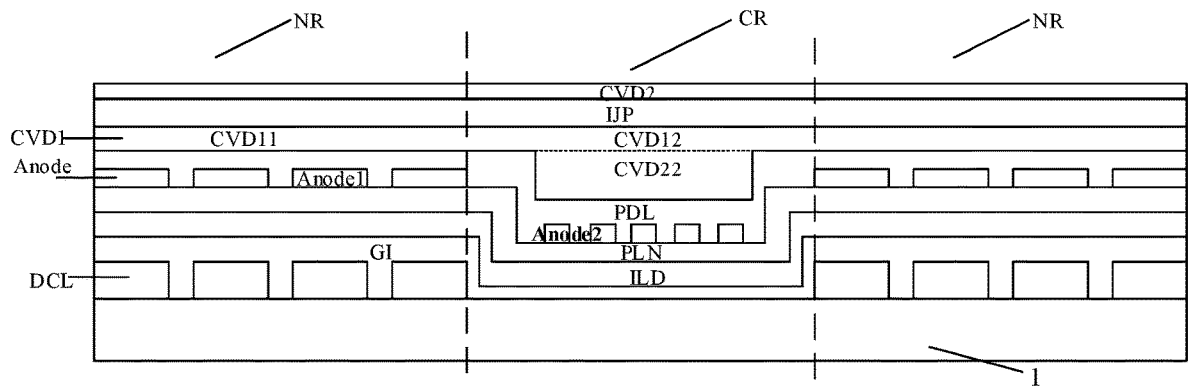
FIG. 4 illustrates a cross-sectional view of an OLED display panel according to an embodiment of the present disclosure.

FIG. 4 shows a schematic cross-sectional view of a display panel according to an embodiment of the present disclosure. Unlike the display panel in related art shown in FIG. 1A, the display panel of the embodiment of the present disclosure includes a base substrate 1, a gate insulating layer GI, a planarization layer PLN, an anode layer Anode, a pixel defining layer PDL, a first insulating layer CVD1, an encapsulation leveling layer IJP, and a second insulating layer CVD2 formed on the base substrate 1. As shown in FIG. 4, the display panel of the embodiment of the present disclosure further includes a third insulating sub-layer CVD22 as a functional film layer FL formed in the light transmission region CR, and a height of the third insulating sub-layer CVD22 and a height of the pixel defining layer PDL in the normal display region NR may be substantially the same; or a difference between the heights of the third insulating sub-layer CVD22 and the pixel defining layer PDL in the normal display region NR is less than the first threshold (for example, the first threshold may be 0.2 µm, and the effect is better when the first threshold is 0.1 µm). The display panel further includes the first insulating layer CVD1 having a one-piece structure formed in both the light transmission region CR and the normal display region NR. Alternatively, the first insulating layer CVD1 and the third insulating sub-layer CVD22 may have a one-piece structure. For example, the first insulating layer material (e.g., silicon oxide, silicon nitride, or silicon oxynitride) in the light transmission region CR may be substantially flush with the first insulating layer material in the normal display region NR through an ashing process and by a half-tone mask, similarly to the method shown in FIG. 7. As shown in FIG. 4, the functional film layer FL (the third insulating sub-layer CVD22 shown in FIG. 4) is provided, such that surfaces of the first insulating layer CVD1 of the display panel are almost flush with each other in the light transmission region CR and the normal display region NR. With such a configuration, a flat encapsulation leveling layer IJP may be formed later, which may solve the problem of distortion of diffraction spots and reduction in imaging resolution caused by the recess of the encapsulation leveling layer IJP in the light transmission region CR as shown in FIG. 1A in related art.

Figure 5:
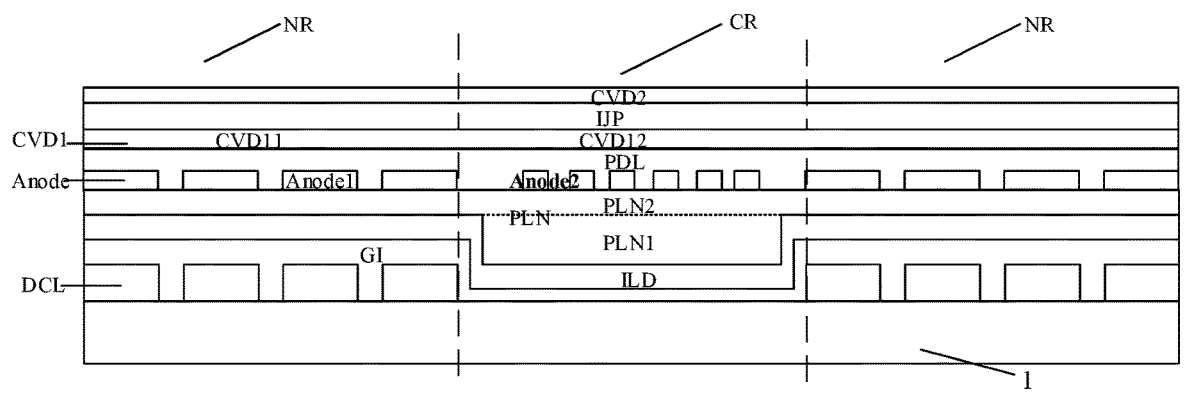
FIG. 5 illustrates a cross-sectional view of an OLED display panel according to an embodiment of the present disclosure.

FIG. 5 shows a schematic cross-sectional view of a display panel according to an embodiment of the present disclosure. Unlike the display panel in related art shown in FIG. 1A, the display panel of the embodiment of the present disclosure includes a base substrate 1, a gate insulating layer GI, an interlayer dielectric layer ILD, an anode layer Anode, a pixel defining layer PDL, a first insulating layer CVD1, an encapsulation leveling layer IJP, and a second insulating layer CVD2 formed on the base substrate. As shown in FIG. 5, the display panel according to the embodiment of the present disclosure further includes a first planarization sub-layer PLN1 as a functional film layer FL formed in the light transmission region CR, and a height of the first planarization sub-layer PLN1 and a height of the interlayer dielectric layer ILD in the normal display region NR may be substantially the same, or a difference between the heights of the first planarization sub-layer PLN1 and the interlayer dielectric layer ILD in the normal display region NR is less than the first threshold (for example, the first threshold may be 0.2 µm, and the less the first threshold is, the better the effect is; for example, the effect is better when the first threshold 0.1 µm). The display panel further includes the first planarization sub-layer PLN1 having a one-piece structure formed in both the light transmission region CR and the normal display region NR. Optionally, the first planarization sub-layer PLN1 and the second planarization sub-layer PLN2 may have a one-piece structure. For example, the planarization layer material (e.g., polyimide) in the light transmission region CR may be substantially flush with the planarization layer material in the normal display region NR through an ashing process and by a half-tone mask, similarly to the method shown in FIG. 7. As shown in FIG. 5, the functional film layer FL (the first planarization sub-layer PLN1 shown in FIG. 5) is provided, such that surfaces of the first insulating layer CVD1 of the display panel are almost flush with each other in the light transmission region CR and the normal display region NR. With such a configuration, a flat encapsulation leveling layer IJP may be formed, which may solve the problem of distortion of diffraction spots and reduction in imaging resolution caused by the recess of the encapsulation leveling layer IJP in the light transmission region CR as shown in FIG. 1A in related art.

Figure 6:
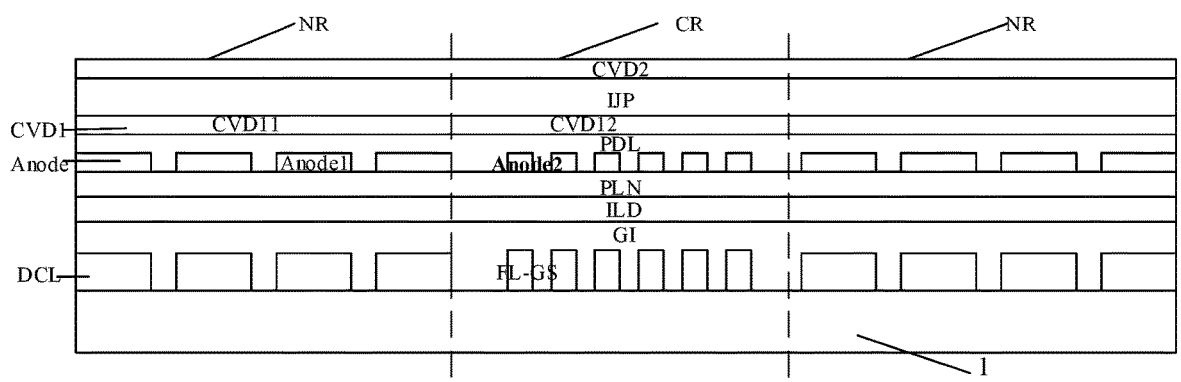
FIG. 6 illustrates a cross-sectional view of an OLED display panel according to an embodiment of the present disclosure.

FIG. 6 shows a schematic cross-sectional view of a display panel according to an embodiment of the present disclosure. Unlike the display panel in related art shown in FIG. 1A, the display panel of the embodiment of the present disclosure includes a base substrate 1, a gate insulating layer GI, an interlayer dielectric layer ILD, a planarization layer PLN, an anode layer Anode, a pixel defining layer PDL, a first insulating layer CVD1, an encapsulation leveling layer IJP, and a second insulating layer CVD2 formed on the base substrate 1. As shown in FIG. 6, the display panel of the embodiment of the present disclosure further includes a driving circuit layer DCL formed in the normal display region NR and a driving circuit functional layer FL-GS as the functional film layers FL formed in the light transmission region CR. In this embodiment, the driving circuit functional layer FL-GS includes a plurality of functional blocks, orthographic projections of which on the base substrate 1 at least partially overlap with orthographic projections of the plurality of second anodes on the base substrate 1. For example, the orthographic projections of the plurality of functional blocks on the base substrate 1 fall within the orthographic projections of the plurality of second anodes on the base substrate 1, to avoid blocking light transmission; the driving circuit functional layer FL-GS may be formed while the driving circuit layer DCL in the normal display region NR is formed on the base substrate 1. That is, the driving circuit layer DCL and the driving circuit functional layer FL-GS may be formed simultaneously using the same material and the same process. A height of the driving circuit layer DCL in the normal display region NR and a height of the driving circuit functional layer FL-GS in the light transmission region CR may be substantially the same, or a difference between the heights of the driving circuit layer DCL in the normal display region NR and the driving circuit functional layer FL-GS in the light transmission region CR is less than the first threshold (for example, the first threshold may be 0.2 μm, however, the less the difference is, the better the effect is, for example, the effect is better when the difference is less than 0.1 μm). In this embodiment, the driving circuit functional layer FL-GS in the light transmission region CR functions only to elevate the light transmission region CR, and is not used to drive the sub-pixels in the light transmission region CR. Therefore, the plurality of functional blocks included in the driving circuit functional layer FL-GS in the embodiment of the present disclosure are floating. As described above, the driving circuits, which are configured to drive the sub-pixels in the light transmission region CR to cause the light-emitting devices in the sub-pixels to emit light, may be disposed in the peripheral region PR, or the driving circuits are compressed, and then, disposed in the driving circuit layer in the normal display region NR. As shown in FIG. 6, the functional film layer FL (the driving circuit functional layer FL-GS as shown in FIG. 6) is provided, such that surfaces of the first insulating layer CVD1 of the display panel are almost flush with each other in the light transmission region CR and the normal display region NR. With such a configuration, a flat encapsulation leveling layer IJP may be formed, which may solve the problem of distortion of diffraction spots and reduction in imaging resolution caused by the recess of the encapsulation leveling layer IJP in the light transmission region CR as shown in FIG. 1A in related art.

In the display panel of the embodiment of the present disclosure, as shown in FIGS. 2A to 6, in order to increase the light transmittance of the light transmission region CR, the driving circuit layer for driving the sub-pixels in the light transmission region CR is externally disposed, for example, in the normal display region NR and the peripheral region PR outside the light transmission region CR. This arrangement causes the light transmission region CR to be recessed, and thus, the subsequently formed layers are recessed. For example, the encapsulation leveling layer IJP formed by an ink-jet printing method is recessed, which causes the front surface of the light transmission region CR, where the camera is provided on the back surface, to be recessed, resulting in distortion of diffraction spots and reduction in imaging resolution. To solve this problem, the present disclosure provides the functional film layer CR in the light transmission region CR to compensate for the height difference between the light transmission region CR and the normal display region NR caused by the driving circuit layer in the light transmission region CR being externally disposed, so that the total height of the layers in the light transmission region CR is almost equal to the total height of the layers in the normal display region NR, and thus, a portion of the subsequently formed encapsulation leveling layer IJP in the light transmission region CR is almost flush with a portion of the subsequently formed encapsulation leveling layer IJP in the normal display region NR. For example, the height difference between the portion of the subsequently formed encapsulation leveling layer IJP in the light transmission region CR and the portion of the subsequently formed encapsulation leveling layer IJP in the normal display region NR may be less than the first threshold, which, for example, may be 0.2 μm. Further, the less the height difference is, the better it is. For example, the effect is better when the height difference is less than 0.1 μm, so as to eliminate the step difference between the light transmission region CR and the normal display region NR, to improve the flatness of the encapsulation leveling layer IJP, and thus, to eliminate or reduce the spherical aberration and dispersion caused by the collapse of the encapsulation leveling layer IJP in related art.

As described above, compared with the related art, the display panel according to the present disclosure adds the functional film layer FL, such as the first gate insulating sub-layer GI1 as the functional film layer FL shown in FIGS. 2A and 2B, the first interlayer dielectric layer ILD1 as the functional film layer FL shown in FIG. 3A, the third insulating sub-layer CVD22 as the functional film layer FL shown in FIG. 4, the first planarization sub-layer PLN1 as the functional film layer FL shown in FIG. 5, and the driving circuit functional layer FL-GS as the functional film layer FL shown in FIG. 6, into the light transmission region CR, so as to compensate for the depth of recess of the light transmission region CR due to the driving circuit for driving the sub-pixels in the light transmission region CR being externally disposed to increase the light transmittance of the light transmission region CR.

The present disclosure is described by the embodiments shown in FIGS. 2A to 6, but the present disclosure is not limited thereto. The display panel according to the embodiment of the present disclosure may be a display panel based on the OLED device shown in FIG. 1C. As described above, the OLED device in the display panel of the present disclosure may include the base substrate 1, the barrier layer 9, the thin film transistor 5 including the gate electrode 51, the source electrode 52, and the drain electrode 53, the insulating layer 6, the cathode connection line 2, the connection electrode 7 disposed in the via hole 61, the anode 31, the light emitting layer 32, the cathode 33, the pixel defining layer 4, the thin film encapsulation layer 10, and the like formed on the base substrate 1. The insulating layer 6 shown in FIG. 1C may be the gate insulating layer GI and/or the planarization layer PLN shown in FIGS. 2A to 6, the layer where the thin film transistor 5 in FIG. 1C is located may be the driving circuit layer DCL shown in FIGS. 2A to 6, the layer where the anode 31 shown in FIG. 1C is located may be the first anode layer Anode1 or the second anode layer Anode2 shown in FIGS. 2A to 6, the pixel defining layer 4 shown in FIG. 1C may be the pixel defining layer PDL shown in FIGS. 2A to 6, and the thin film encapsulation layer 10 shown in FIG. 1C may be the encapsulation leveling layer IJP shown in FIGS. 2A to 6.

That is, when forming the display panel as shown in FIGS. 2A to 6, the respective layers of the display panel as shown in FIGS. 2A to 6 may be formed according to the respective special layer structures forming the OLED device. For example, the driving circuit layer shown in FIG. 1C includes a bottom gate type transistor. As known by one of ordinary skill in the art, when forming the bottom gate type transistor, the gate electrode is firstly formed, and then, the gate insulating layer and the source/drain layer are formed, so that an insulating layer formed between the anode and the transistor may not be as the gate insulating layer. If the driving transistor used in the OLED device of the OLED display panel is the top gate type thin film transistor, the insulating layer formed between the anode and the transistor may be the gate insulating layer, and the gate insulating layer in this case may be the gate insulating layer GI shown in FIGS. 2A to 6 of the embodiments of the present disclosure. Accordingly, the gate insulating layer and the pixel defining layer described in the above embodiments of the present disclosure may be the respective layers for forming the OLED device. That is, the gate insulating layer forming the thin film transistor may be the gate insulating layer GI shown in FIGS. 2A to 6; and the pixel defining layer having the pixel defining function when forming the OLED device may be the pixel defining layer PDL shown in FIGS. 2A to 6 of the embodiments of the present disclosure. However, the present disclosure is not limited thereto, and the respective layers illustrated in FIGS. 2A to 6 are only layers enumerated to illustrate embodiments of the present disclosure.

In order to increase the light transmittance of the light transmission region CR, a transparent material may be selected as each layer of the display panel. As described above, the gate insulating layer may be formed by using silicon oxide, silicon nitride, and/or silicon oxynitride; the interlayer dielectric layer may also be formed by using silicon oxide, silicon nitride, and/or silicon oxynitride; the planarization layer may be formed by using polyimide; the first and second insulating layers may be formed by using silicon oxide, silicon nitride, and/or silicon oxide materials; and the anode layer may be formed by using conventional ITO (Indium Tin Oxide). The present disclosure is not limited to this. For example, other materials may be employed to form the various layers.

Figure 7:
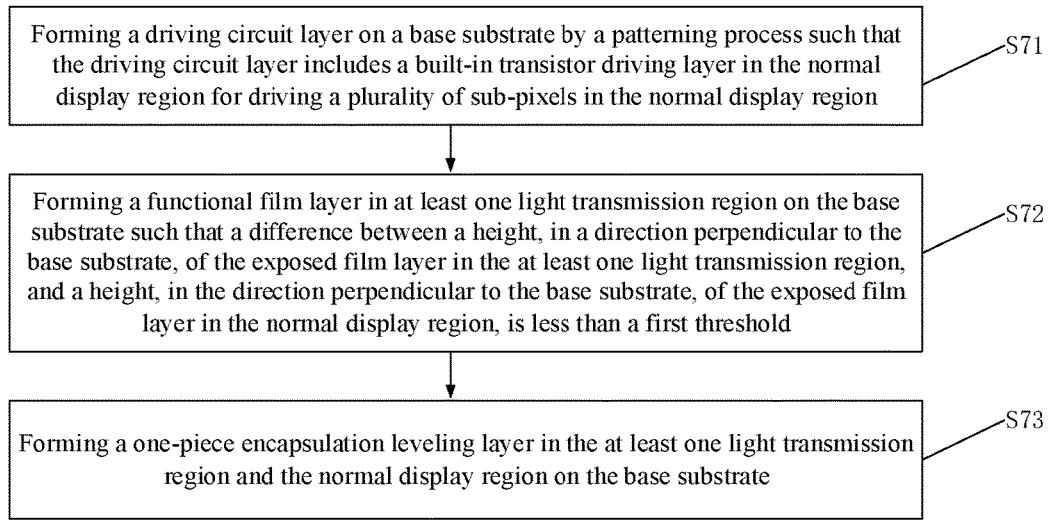
FIG. 7 illustrates a flow chart of a method for manufacturing an OLED display panel according to an embodiment of the present disclosure.

According to another aspect of the present disclosure, there is also provided a method for manufacturing the above display panel. As shown in FIG. 7, the method includes steps S71 to S73. Step S71, a driving circuit layer is formed on a base substrate through a patterning process, so that the driving circuit layer includes a built-in transistor driving layer positioned in the normal display region, for driving a plurality of sub-pixels in the normal display region; step S72, a functional film layer is formed in at least one light transmission region on the base substrate, so that a difference between a height, in a direction perpendicular to the base substrate, of the exposed film layer in the at least one light transmission region, and a height, in the direction perpendicular to the base substrate, of the exposed film layer in the normal display region, is less than a first threshold; step S73, a one-piece encapsulation leveling layer is formed in the at least one light transmission region and the normal display region on the base substrate.

Figure 8:
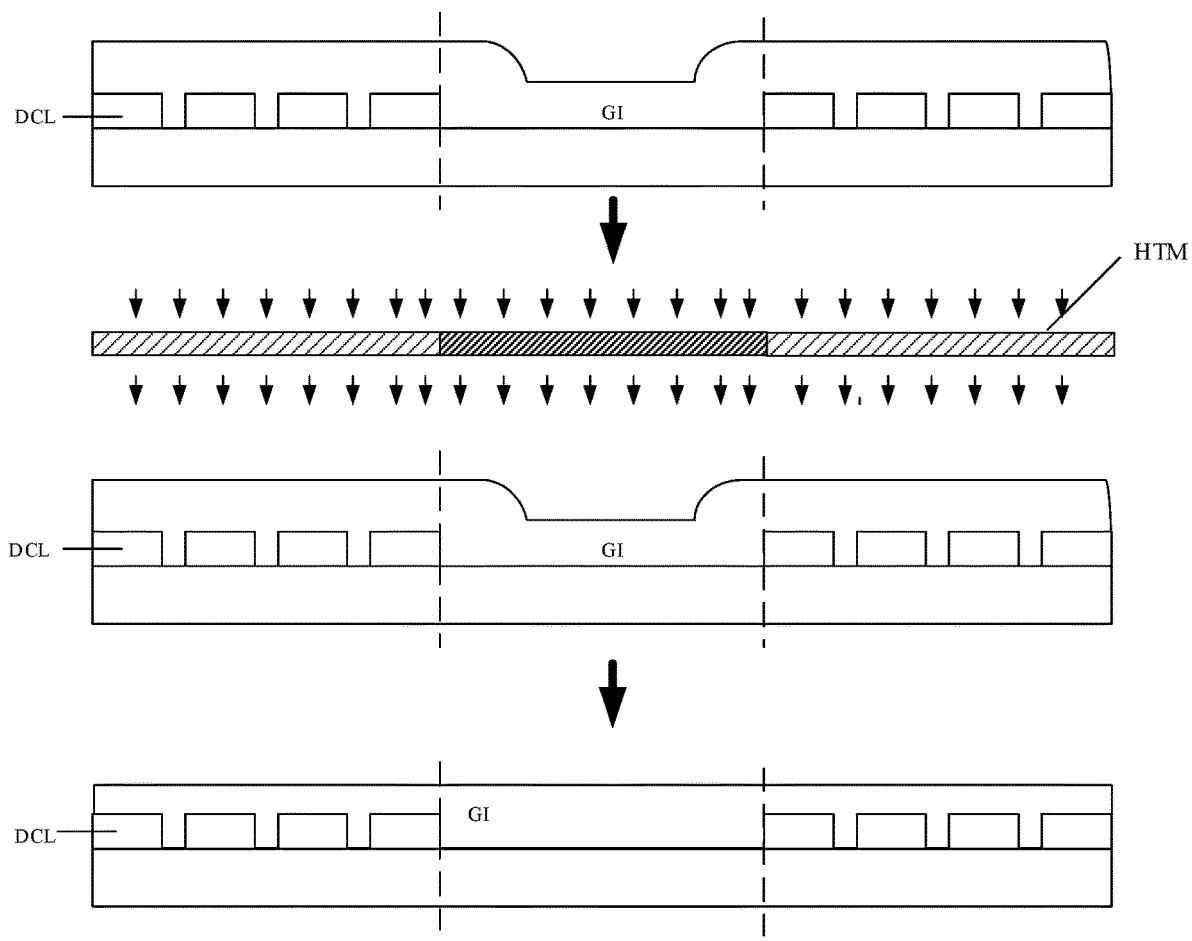
FIG. 8 illustrates an example diagram of forming an OLED display panel according to an embodiment of the present disclosure.

As shown in FIG. 8, the step of forming a functional film layer in at least one light transmission region on the base substrate includes the following steps: forming a functional film layer material on the base substrate; and forming a pattern of the functional film layer through an ashing process by using a half-tone mask HTM, so that a difference between the height, in the direction perpendicular to the base substrate, of the exposed film layer in the at least one light transmission region, and the height, in the direction perpendicular to the base substrate, of the exposed film layer in the normal display region, is less than the first threshold.

As shown in FIG. 8, when the driving circuit layer DCL is formed in the normal display region NR and the driving circuit layer is not disposed in the light transmission region CR, the functional film material (e.g., a gate insulating material layer) is formed on the base substrate 1. The gate insulating material layer is formed to have a recessed structure since the height of the film layer in the light transmission region CR is lower than that in the normal display region NR surrounding the light transmission region CR. A height of the portion of the recessed structure in the light transmission region CR is greater than a height of the driving circuit layer DCL. The gate insulating material layer is subjected to an ashing process by using a half-tone mask HTM which has different transmittances for light in the light transmission region CR and the normal display region NR. After the ashing process, the less material in the gate insulating material layer in the light transmission region CR is removed, and the more material in the gate insulating material layer in the normal display region NR is removed, so that a height difference of the ashed gate insulating layer GI in the light transmission region CR and the normal display region NR is less than the first threshold, so as to reduce the height difference between the two regions, to eliminate the step difference between the light transmission region CR and the normal display region NR, to improve the flatness of the subsequently formed encapsulation leveling layer IJP, thereby eliminating or reducing the spherical aberration and dispersion caused by the collapse of the encapsulation leveling layer IJP in related art.

FIG. 8 illustrates only one embodiment of the present disclosure, and the formed gate insulating layer GI includes a first gate insulating sub-layer GI1 and a second gate insulating sub-layer GI2 which have a one-piece structure. However, the present disclosure is not limited thereto. For example, when the gate insulating layer shown in FIGS. 2A and 2B is formed, the first gate insulating sub-layer GI1 as shown in FIG. 2A may be formed in the light transmission region CR through a patterning process to reduce a step difference between the light transmission region CR and the normal display region NR, and then, the almost flat second gate insulating sub-layer GI2 may be formed.

FIG. 8 shows only a method for forming the gate insulating layer GI including the first gate insulating sub-layer GI1 as the functional film layer FL. The interlayer dielectric layer ILD including the first interlayer insulating sub-layer ILD1 as the functional film layer FL, the first insulating layer CVD1 including the third insulating sub-layer CVD22 as the functional film layer FL, and the planarization layer PLN including the first planarization sub-layer PLN1 as the functional film layer FL, shown in FIGS. 3A to 5, may also be formed in a similar manner.

FIG. 10 shows a flow chart of a method for manufacturing a display panel according to an embodiment of the present disclosure. The method includes steps S91 and S92. At step S91, the step of forming the functional film layer in the at least one light transmission region on the base substrate includes: forming the driving circuit layer on the base substrate through a patterning process, while forming the driving circuit functional layer including a plurality of functional blocks in the at least one light transmission region on the base substrate through the same patterning process, the driving circuit functional layer being in a same layer as the built-in transistor driving layer, so that orthographic projections of the plurality of functional blocks on the base substrate respectively at least partially overlap with orthographic projections of the plurality of second anodes on the base substrate (e.g., within orthographic projections of the plurality of second anodes on the base substrate, to avoid a reduction in light transmittance); in step S92, the gate insulating layer, the interlayer dielectric layer, the planarization layer, the anode layer, the pixel defining layer, the first insulating layer, the encapsulation leveling layer, and the second insulating layer, are sequentially formed on the base substrate.

In addition to forming the functional film layer, other layers in the display panel of the embodiment of the present disclosure may be manufactured by using related techniques. For example, the gate insulating layer, the interlayer dielectric layer, the first insulating layer, and the second insulating layer are formed by a vapor deposition method. In the present disclosure, the encapsulation leveling layer may be formed by an inkjet printing method. After the functional film FL is disposed in the light transmission region, the encapsulation leveling layer IJP formed by the inkjet printing method will be flat, and thus the spherical aberration and dispersion caused by collapse of the encapsulation leveling layer IJP in related art may be eliminated or reduced.

According to another aspect of the present disclosure, there is also provided a display apparatus, which includes the display panel according to the above embodiments and at least one photosensitive device, such as a camera 200, disposed within at least one light transmission region of the display panel and located on a side of the base substrate away from the anode layer, such as shown in FIG. 11.

The display apparatus provided by the embodiment of the present disclosure may be any product or component with a display function, such as a mobile phone, a tablet computer, a television, a display, a notebook computer, a digital photo frame, a navigator and the like. The functional film layer is arranged in the light transmission region in the display panel of the display device provided by the embodiment to compensate for the recess depth caused by the driving circuit layer in the light transmission region being externally provided, so that the height difference of the encapsulation leveling layer on top of the display panel in the light transmission region and the normal display region is less than the first threshold. For example, the encapsulation leveling layer is almost flush both in the light transmission region and in the normal display region, and thus the spherical aberration and dispersion caused by the collapse of the encapsulation leveling layer IJP in related art are eliminated or reduced. Other essential components of the display apparatus are understood by one of ordinary skill in the art, and are not described herein or should not be construed as limiting the invention.

It is to be understood that the above embodiments are merely exemplary embodiments employed for illustrating the principles of the present disclosure, and the present disclosure is not limited thereto. It will be apparent to one of ordinary skill in the art that various changes and modifications may be made without departing from the spirit and scope of the present disclosure, and these changes and modifications are to be considered within the scope of the present disclosure.

What is claimed is:

1. A display panel, comprising: a display region and at least one light transmission region at least partially surrounded by the display region, wherein the display panel comprises:
   a base substrate;
   a driving circuit layer, which is on the base substrate and comprises a first driving circuit in the display region, for driving a plurality of sub-pixels in the display region;
   an anode layer, comprising a first anode sub-layer in the display region and over the driving circuit layer and a second anode sub-layer in the at least one light transmission region, wherein the first anode sub-layer is connected to the first driving circuit and comprises a plurality of first anodes insulated and spaced apart from each other, and the second anode sub-layer comprises a plurality of second anodes insulated and spaced apart from each other;
   a first insulating layer over the anode layer and comprising a first insulating sub-layer in the display region and a second insulating sub-layer in the at least one light transmission region;
   a functional film layer in the at least one light transmission region and on a side of the second insulating sub-layer close to the base substrate, wherein the functional film layer has a first thickness in a direction perpendicular to the base substrate, so that a height difference between a first height, in the direction perpendicular to the base substrate, of a first surface of the first insulating sub-layer away from the base substrate, and a second height, in the direction perpendicular to the base substrate, of a second surface of the second insulating sub-layer away from the base substrate, is less than a first threshold; and
   an encapsulation leveling layer on surfaces of the first insulating sub-layer and the second insulating sub-layer away from the base substrate;
   wherein the first threshold is 0.2 μm.

2. The display panel according to claim 1, further comprising a second driving circuit in a peripheral region which at least partially surrounds the display region or in the display region and disposed in a same layer as the first driving circuit, the second driving circuit being connected to the second anode sub-layer, for driving a plurality of sub-pixels in the at least one light transmission region.

3. The display panel according to claim 1, comprising an insulating film layer in the at least one light transmission region and the display region, wherein
the functional film layer is on a surface of the insulating film layer proximal to the base substrate;
a height difference between a height, in the direction perpendicular to the base substrate, of a surface of a portion of the insulating film layer in the at least one light transmission region, away from the base substrate, and a height, in the direction perpendicular to the base substrate, of a surface of a portion of the insulating film layer in the display region, away from the base substrate, is less than the first threshold; and
the insulating film layer and the functional film layer have a one-piece structure.

4. The display panel according to claim 3, wherein the insulating film layer comprises a gate insulating layer on a side of the driving circuit layer away from the base substrate.

5. The display panel according to claim 4, further comprising:
an interlayer dielectric layer on a surface of the gate insulating layer away from the base substrate;
a planarization layer on a surface of the interlayer dielectric layer away from the base substrate, wherein the anode layer is on the planarization layer; and
a pixel defining layer on the anode layer, wherein the first insulating layer is on the pixel defining layer.

6. The display panel according to claim 3, wherein the insulating film layer comprises an interlayer dielectric layer on a side of the driving circuit layer away from the base substrate.

7. The display panel according to claim 3, further comprising:
a gate insulating layer on a surface of the driving circuit layer away from the base substrate, and in the at least one light transmission region and the display region, wherein the functional film layer is on a side of the gate insulating layer in the at least one light transmission region away from the base substrate; wherein
the insulating film layer comprises an interlayer dielectric layer on a side of the gate insulating layer in the display region and the functional film layer away from the base substrate.

8. The display panel according to claim 6, further comprising:
a planarization layer on a surface of the interlayer dielectric layer away from the base substrate, wherein the anode layer is on the planarization layer; and
a pixel defining layer on the anode layer, wherein the first insulating layer is on the pixel defining layer.

9. The display panel according to claim 3, wherein the insulating film layer is the first insulating layer; and
the display panel further comprises:
a gate insulating layer on a surface of the driving circuit layer away from the base substrate, and in the at least one light transmission region and the display region;
an interlayer dielectric layer on a surface of the gate insulating layer away from the base substrate; and
a planarization layer on a surface of the interlayer dielectric layer away from the base substrate, wherein
the anode layer is on the planarization layer, and a height, in the direction perpendicular to the base substrate, of a surface of the first anode sub-layer away from the base substrate, is greater than a height, in the direction perpendicular to the base substrate, of a surface of the second anode sub-layer away from the base substrate.

10. The display panel according to claim 3, wherein the insulating film layer comprises a planarization layer on a surface of the anode layer proximal to the base substrate.

11. The display panel according to claim 10, further comprising:
a gate insulating layer on a surface of the driving circuit layer away from the base substrate, and in the at least one light transmission region and the display region;
an interlayer dielectric layer on the gate insulating layer in the at least one light transmission region and the display region; and
a pixel defining layer on a side of the anode layer away from the base substrate.

12. The display panel according to claim 1, wherein
the functional film layer comprises a driving circuit functional layer on a surface of the base substrate in the at least one light transmission region proximal to the second anode sub-layer, and
the driving circuit functional layer comprises a plurality of functional blocks, and orthographic projections of the plurality of functional blocks on the base substrate at least partially overlap with orthographic projections of the plurality of second anodes on the base substrate.

13. The display panel according to claim 12, further comprising:
a gate insulating layer on a surface of the driving circuit functional layer away from the base substrate, and in the at least one light transmission region and the display region;
an interlayer dielectric layer on the gate insulating layer; and
a planarization layer on the interlayer dielectric layer, wherein the anode layer is on the planarization layer.

14. The display panel according to claim 13, wherein each of the plurality of functional blocks is floating, and
each of the plurality of functional blocks comprises a same gate layer and a same source/drain layer as the first driving circuit.

15. The display panel according to claim 1, wherein the functional film layer comprises a gate insulating layer arranged on the base substrate in the at least one light transmission region, and
a difference between a height, in the direction perpendicular to the base substrate, of a surface of the gate insulating layer in the at least one light transmission region away from the base substrate, and a height, in the direction perpendicular to the base substrate, of a surface of the driving circuit layer away from the base substrate, is less than the first threshold.

16. The display panel according to claim 1, wherein a material of the encapsulation leveling layer is an organic material.

17. The display panel according to claim 1, wherein
an area of an orthographic projection of the second anode on the base substrate is smaller than an area of an orthographic projection of the first anode on the base substrate; and
a second distance between every two adjacent second anodes of the plurality of second anodes is substantially equal to a first distance between every two adjacent first anodes of the plurality of first anodes.

18. The display panel according to claim 1, wherein
an area of an orthographic projection of the second anode on the base substrate is substantially equal to an area of an orthographic projection of the first anode on the base substrate.

19. A display apparatus, comprising the display panel according to claim 1 and at least one photosensitive device within the at least one light transmission region of the display panel and on a side of the base substrate away from the anode layer.

20. A method for manufacturing the display panel according to claim 1, comprising:
 forming the driving circuit layer on the base substrate through a patterning process, such that the driving circuit layer comprises the first driving circuit in the display region, for driving the plurality of sub-pixels in the normal display region;
 forming the functional film layer on the base substrate in the at least one light transmission region, such that a difference between a height, in the direction perpendicular to the base substrate, of a surface of an exposed film layer in the at least one light transmission region away from the base substrate, and a height, in the direction perpendicular to the base substrate, of a surface of an exposed film layer in the display region away from the base substrate, is less than the first threshold; and
 forming the encapsulation leveling layer in the at least one light transmission region and the display region on the base substrate.

\* \* \* \* \*